(12) United States Patent
Wang et al.

(10) Patent No.: US 10,157,990 B2
(45) Date of Patent: Dec. 18, 2018

(54) SEMICONDUCTOR DEVICE WITH CAPPING STRUCTURE AND METHOD OF FORMING THE SAME

(71) Applicant: TAIWAN SEMICONDUCTOR MANUFACTURING CO., LTD., Hsinchu (TW)

(72) Inventors: Chung-Ming Wang, Hsinchu (TW); Fang-Ting Kuo, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/456,799

(22) Filed: Mar. 13, 2017

(65) Prior Publication Data

US 2018/0166545 A1  Jun. 14, 2018

Related U.S. Application Data

(60) Provisional application No. 62/431,518, filed on Dec. 8, 2016.

(51) Int. Cl.
| | |
|---|---|
| *H01L 21/762* | (2006.01) |
| *H01L 29/423* | (2006.01) |
| *H01L 29/06* | (2006.01) |
| *H01L 29/78* | (2006.01) |
| *H01L 21/28* | (2006.01) |
| *H01L 29/66* | (2006.01) |

(52) U.S. Cl.
CPC .... *H01L 29/4232* (2013.01); *H01L 21/28017* (2013.01); *H01L 21/76224* (2013.01); *H01L 29/0649* (2013.01); *H01L 29/66477* (2013.01); *H01L 29/78* (2013.01)

(58) Field of Classification Search
CPC ........... H01L 29/4232; H01L 29/66477; H01L 29/78; H01L 29/0649
See application file for complete search history.

(56) References Cited

U.S. PATENT DOCUMENTS

| 6,352,900 B1* | 3/2002 | Mehrotra | H01L 21/28247 438/303 |
| 6,444,512 B1* | 9/2002 | Madhukar | H01L 21/82384 257/E21.444 |
| 2004/0164320 A1* | 8/2004 | Quek | H01L 29/6656 257/197 |
| 2005/0045923 A1* | 3/2005 | Chambers | H01L 21/28079 257/288 |

(Continued)

*Primary Examiner* — Kyoung Lee
*Assistant Examiner* — Christina Sylvia
(74) *Attorney, Agent, or Firm* — McClure, Qualey & Rodack, LLP

(57) ABSTRACT

A semiconductor device is provided, which includes a substrate, a shallow trench isolation (STI), a gate dielectric structure, a capping structure and a gate structure. The STI is in the substrate and defines an active area of the substrate. The gate dielectric structure is on the active area. The capping structure is adjacent to the gate dielectric structure and at edges of the active area. The gate structure is on the gate dielectric structure and the capping structure. An equivalent oxide thickness of the capping structure is substantially greater than an equivalent oxide thickness of the gate dielectric structure.

20 Claims, 14 Drawing Sheets

(56) References Cited

U.S. PATENT DOCUMENTS

2012/0309158 A1* 12/2012 Hung .................... H01L 21/324
                                                        438/301
2013/0043513 A1*  2/2013 Huang .............. H01L 21/76224
                                                        257/288

* cited by examiner

SEMICONDUCTOR DEVICE WITH CAPPING STRUCTURE AND METHOD OF FORMING THE SAME

RELATED APPLICATIONS

This application claims priority to U.S. Provisional Application Ser. No. 62/431,518, filed Dec. 8, 2016, which is herein incorporated by reference.

BACKGROUND

With the increased density of semiconductor devices and the combination of various types of circuitry, such as logic circuits and radio frequency (RF) processing circuits, signal noise generated in an integrated circuit becomes intense. Particularly, in a typical semiconductor device, such as a complementary metal oxide semiconductor (CMOS) device, signal noise from an edge of an active area of a semiconductor device would adversely affect the operation of the semiconductor device. How to reduce signal noise in small and concentrative integrated circuits has now become one of the major tasks in related industries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
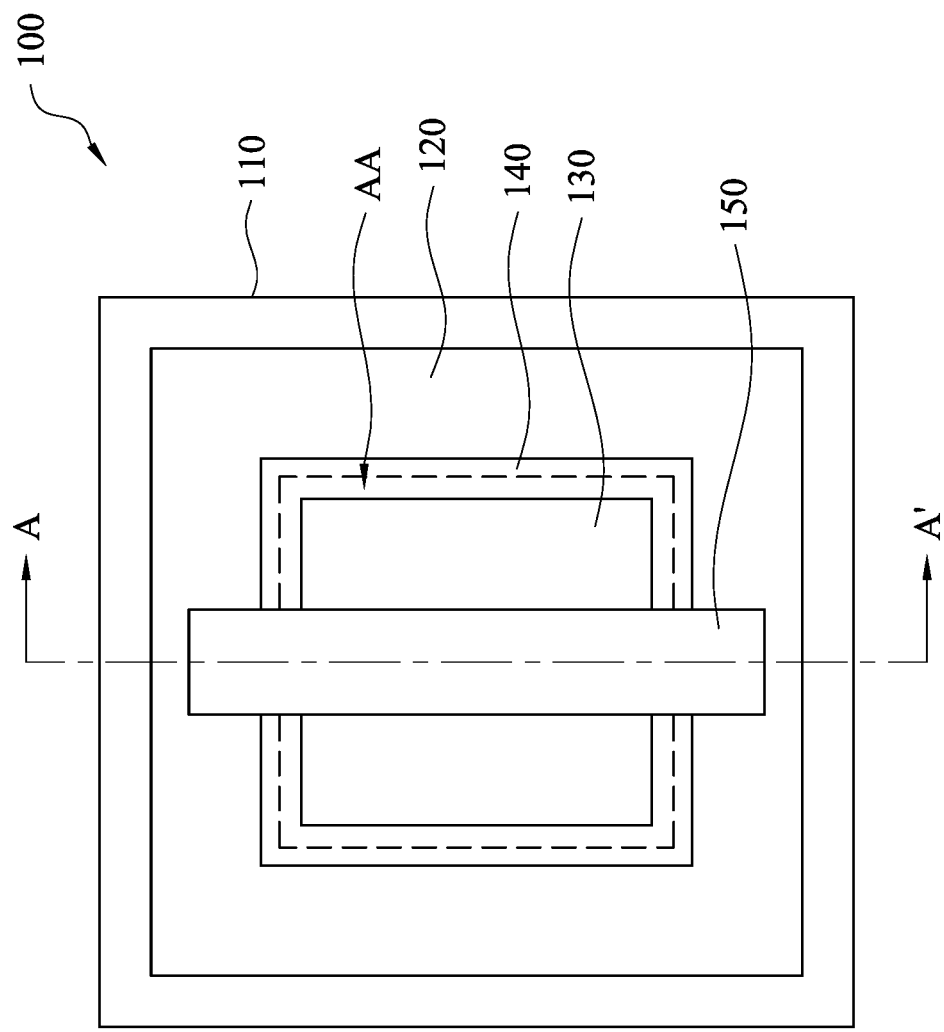
FIG. 1A is a schematic top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first", "second", etc., may be used in the claims to describe various elements, these elements should not be limited by these terms, and these elements correspondingly described in the embodiments are presented by different reference numbers. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Embodiments of the present disclosure are directed to a semiconductor device and methods of forming the same, in which a capping structure is formed at edges of an active area of the semiconductor device. With the capping structure, the equivalent oxide thickness at the edges of the active area increases, and therefore signal noise can be effectively isolated. In comparison with the typical semiconductor device, the semiconductor device in accordance with the embodiments of the present disclosure with a capping structure may provide better noise performance, so as to benefit signal management applications.

Figure 1B:
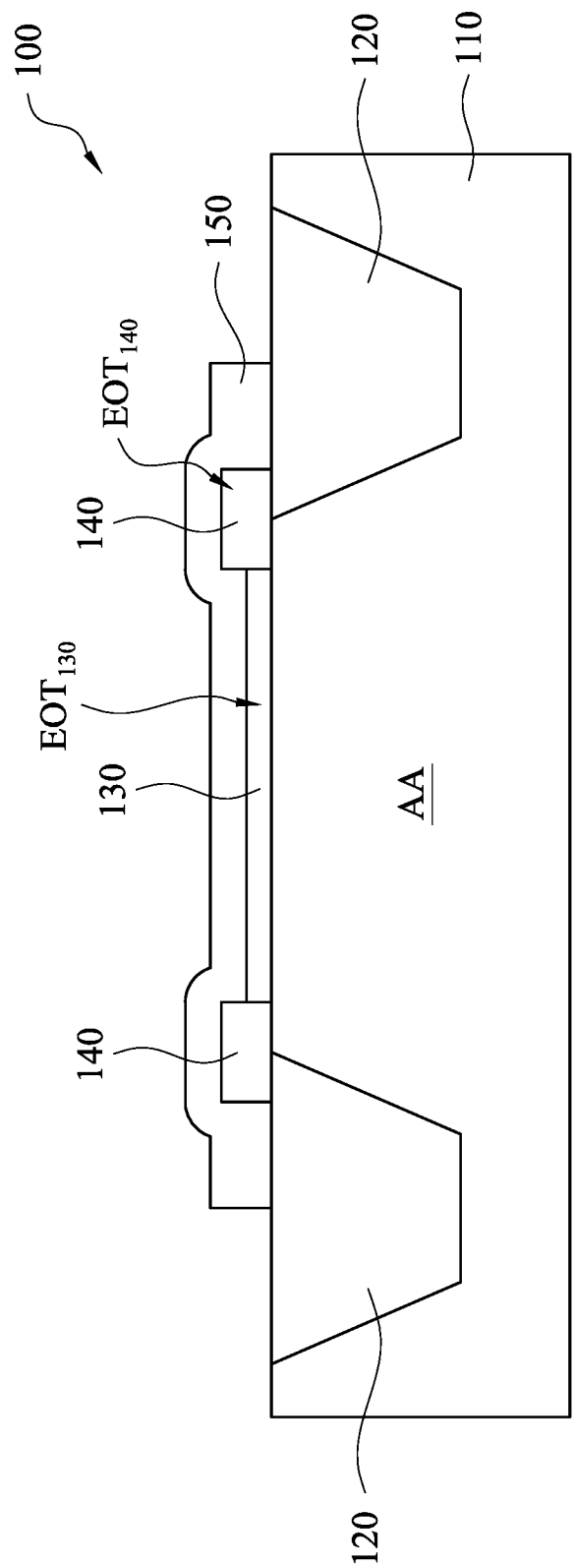
FIG. 1B is a schematic cross-sectional view of the semiconductor device shown in FIG. 1A.

FIG. 1A is a schematic top view of a semiconductor device 100 in accordance with some embodiments of the present disclosure, and FIG. 1B is a schematic cross-sectional view of the semiconductor device 100 along line A-A'. The semiconductor device 100 includes a substrate 110, a shallow trench isolation (STI) 120, a gate dielectric structure 130, a capping structure 140 and a gate structure 150.

The substrate 110 may be, for example, a silicon substrate, a bulk silicon substrate, a germanium substrate, a diamond substrate or a silicon-on-insulator (SOI) substrate. In some other embodiments, the substrate 110 may include a compound semiconductor material such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide.

The STI 120 is in the substrate 110, and the area surrounded by the STI 120 is defined as an active area AA of the semiconductor device 100. The STI 120 may include isolation material, such as silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material.

The gate dielectric structure 130 is on the active area AA of the semiconductor device 100. The gate dielectric structure 130 may include an oxide material such as, but not limited to, silicon oxide, hafnium oxide, titanium oxide, aluminum oxide, tin oxide, zinc oxide, high-k dielectrics, and combinations thereof.

The gate dielectric structure 130 may include one or more gate dielectric layers. In the case of multiple gate dielectric layers, the gate dielectric layers may include the same material or different materials, and the equivalent oxide thickness $EOT_{130}$ of the gate dielectric structure 130 is the sum of the equivalent oxide thicknesses of the gate dielectric layers.

The capping structure 140 is a frame structure which is adjacent to the gate dielectric structure 130 and at edges of the active area AA of the semiconductor device 100. Similarly, the capping structure 140 may include an oxide material such as, but not limited to, silicon oxide, hafnium oxide, titanium oxide, aluminum oxide, tin oxide, zinc oxide, high-k dielectrics, and combinations thereof. The equivalent oxide thickness $EOT_{140}$ of the capping structure 140 is greater than the equivalent oxide thickness $EOT_{130}$ of the gate dielectric structure 130. In particular, if the dielectric constants of the gate dielectric structure 130 and the capping structure 140 are the same, the thickness of the capping structure 140 is greater than that of the gate dielectric structure 130; if the thicknesses of the gate dielectric structure 130 and capping structure 140 are the same, the dielectric constant of the capping structure 140 is greater than that of the gate dielectric structure 130.

The capping structure 140 may include one or more capping layers. In the case of multiple capping layers, the capping layers may include the same material or different materials, and the equivalent oxide thickness $EOT_{140}$ of the capping structure 140 is the sum of the equivalent oxide thicknesses of the capping layers.

The gate structure 150 is on the gate dielectric structure 130 and the capping structure 140. The gate electrode 150 may include a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), polysilicon, combinations thereof, and/or another suitable material.

Figure 1C:
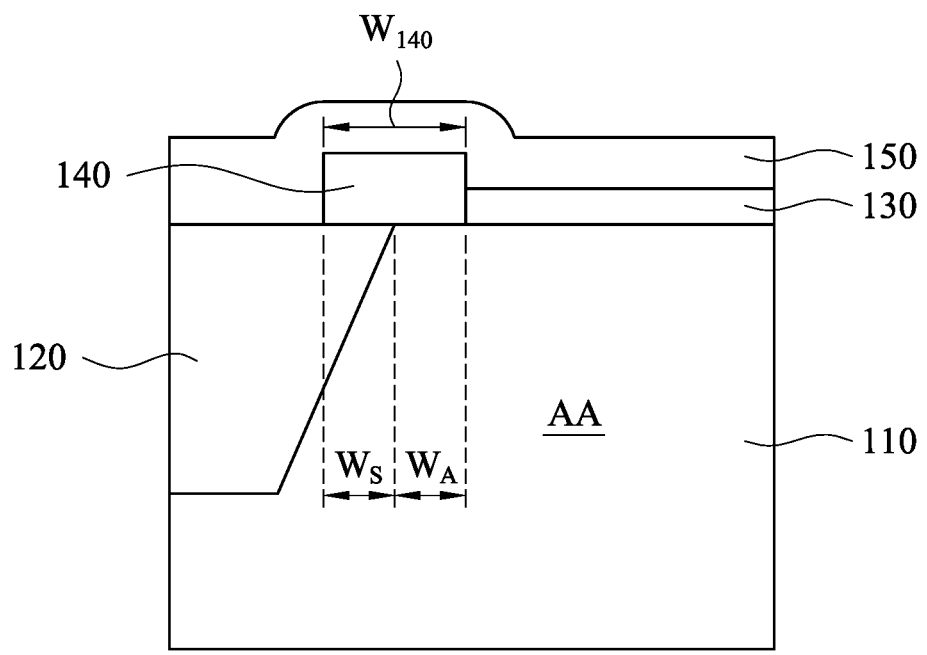
FIG. 1C to FIG. 1E exemplarily illustrate various schematic enlarged partial views of the semiconductor device shown in FIG. 1B.
Figure 1D:
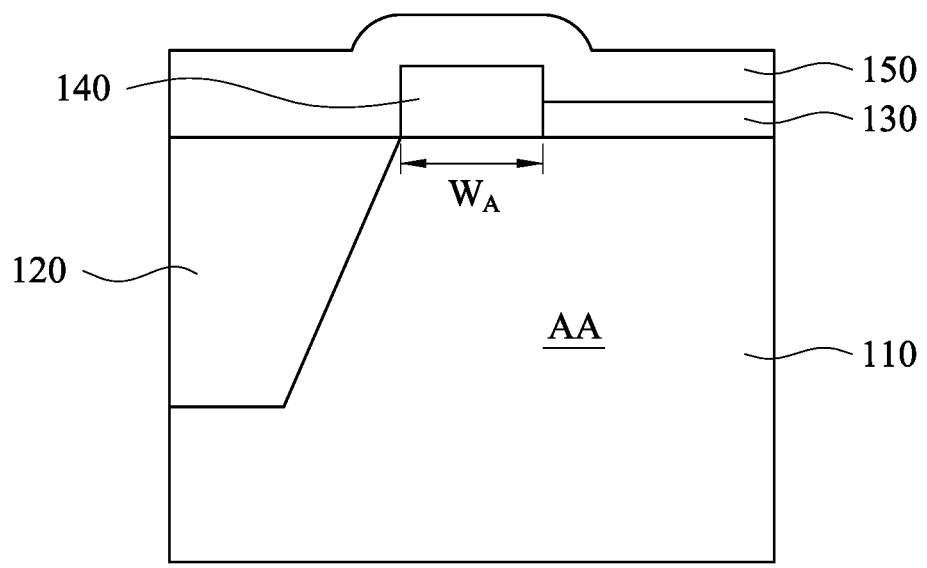
Figure 1E:
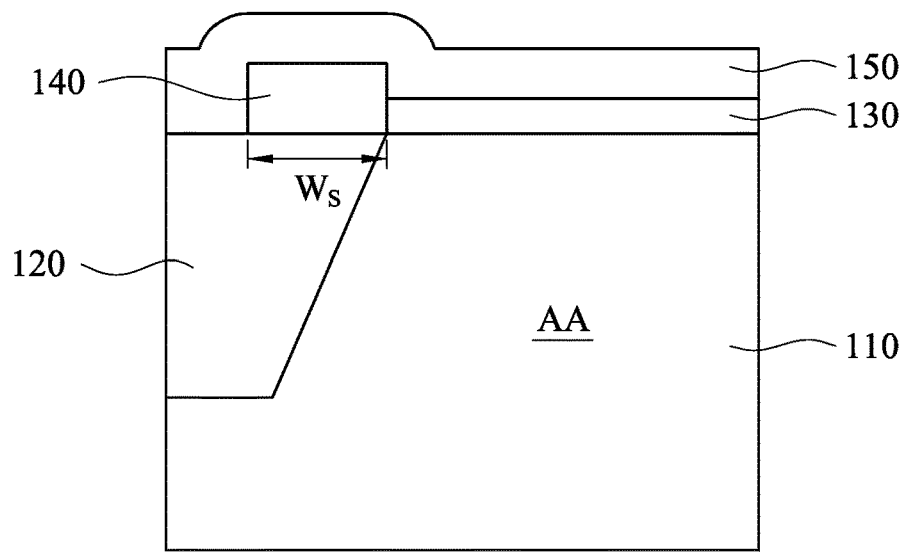

FIG. 1C to FIG. 1E exemplarily illustrate various schematic enlarged partial views of the semiconductor device 100. The capping structure 140 has a width $W_{140}$, which is the sum of the width of the inner portion of the capping structure 140 overlapped with the active area AA (denoted as $W_A$) and the outer portion of the capping structure 140 overlapped with the STI 120 (denoted as $W_S$). In the embodiments shown in FIG. 1C, the capping structure 140 is disposed spanning between the active area AA and the STI 120, and therefore the widths $W_A$ and $W_S$ are both non-zero. In some embodiments, the width $W_{140}$ is at least 1 nm, and both of the widths $W_A$ and $W_S$ are between 0 and 5 nm. In the embodiments shown in FIG. 1D, the capping structure 140 is completely on the active area AA, and therefore the widths $W_A$ and $W_S$ are respectively non-zero and zero. In some embodiments, the width $W_A$ is between 1 nm and 5 nm. The capping structure 140 may be aligned with or be spaced apart from the edge of the STI 120 adjacent to the active area AA. In the embodiments shown in FIG. 1E, the capping structure 140 is completely on the STI 120 and aligned with the edge of the active area AA, and therefore the widths $W_A$ and $W_S$ are respectively zero and non-zero. In some embodiments, the width $W_S$ is between 1 nm and 5 nm.

Figure 1F:
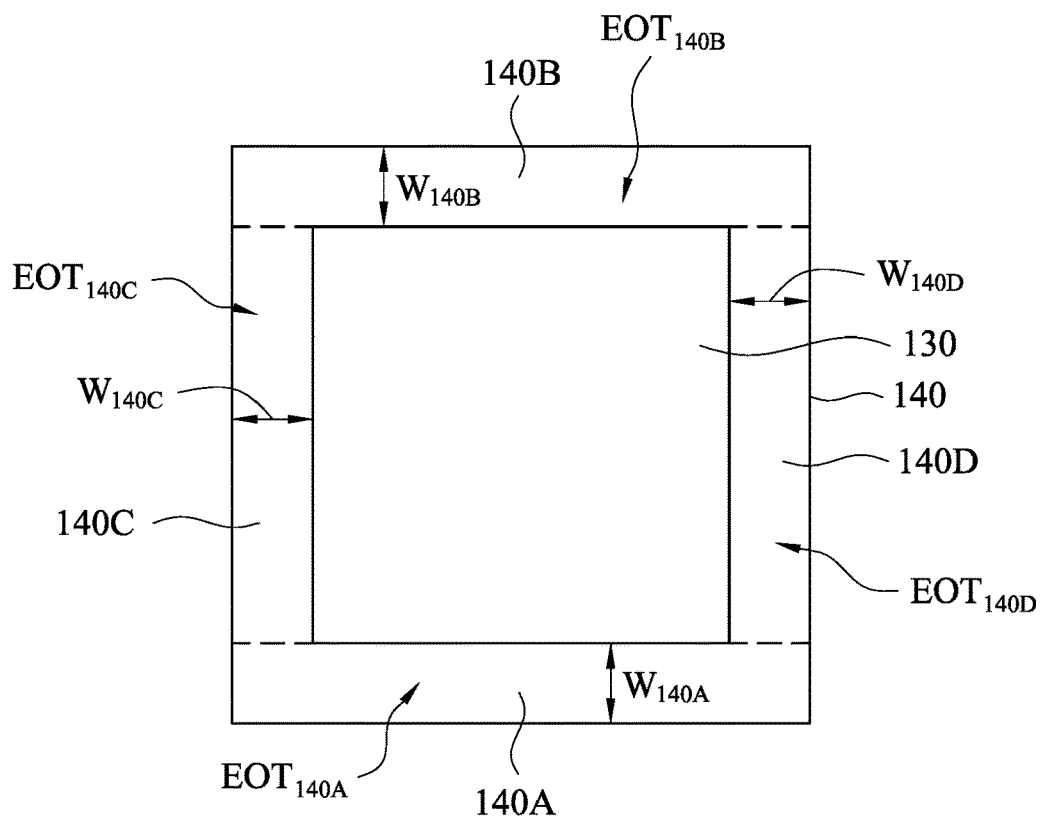
FIG. 1F exemplarily illustrates portions of a capping structure of the semiconductor device shown in FIG. 1A.

In some embodiments, the capping structure 140 may have different equivalent oxide thicknesses and/or widths. FIG. 1F exemplarily illustrates that the capping structure 140 is separated into four portions 140A-140D which are respectively adjacent to the edges of the gate dielectric structure 130. The equivalent oxide thicknesses $EOT_{140A}$-$EOT_{140D}$ of the portions 140A-140D may be different from each other but are all greater than the equivalent oxide thickness $EOT_{130}$ of the gate dielectric structure 130. In addition, the widths $W_{140A}$-$W_{140D}$ of the portions 140A-140D may be the same, or the widths of at least two of the portions 140A-140D may be different from each other.

Further, the arrangement of the portions 140A-140D may be changed or modified in accordance with various applications. For example, the portion 140A may be completely on the active area AA, the portion 140B may be completely on the STI 120, and the portions 140C and 140D may be partially on the active area AA and partially on the STI 120.

In addition, each of the portions 140A-140D may be a single capping layer structure or a multiple capping layer structure. For example, the portions 140A and 140B may be single capping layer structures, and the portions 140C and 140D may include two capping layers.

Figure 1G:
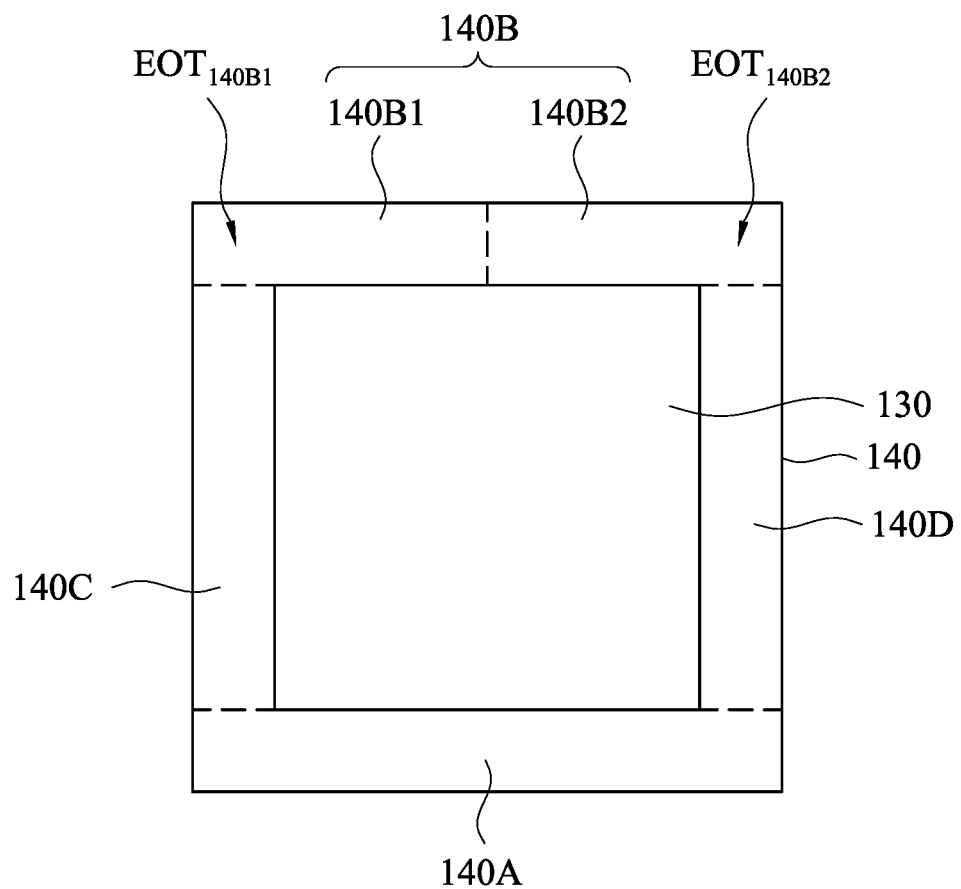
FIG. 1G exemplarily illustrates portions of a capping structure of the semiconductor device shown in FIG. 1A.

It is noted that the arrangement of the portions 140A-140D shown in FIG. 1F is merely for illustrative description and is not intended to limit the scope. For example, FIG. 1G illustratively shows that the portion 140B of the capping structure 140 is further separated into two sub-portions 140B1 and 140B2. The equivalent oxide thicknesses $EOT_{140B1}$ and $EOT_{140B2}$ of the sub-portions 140B1 and 140B2 may be different from each other but are all greater than the equivalent oxide thickness $EOT_{130}$ of the gate dielectric structure 130.

Figure 2A:
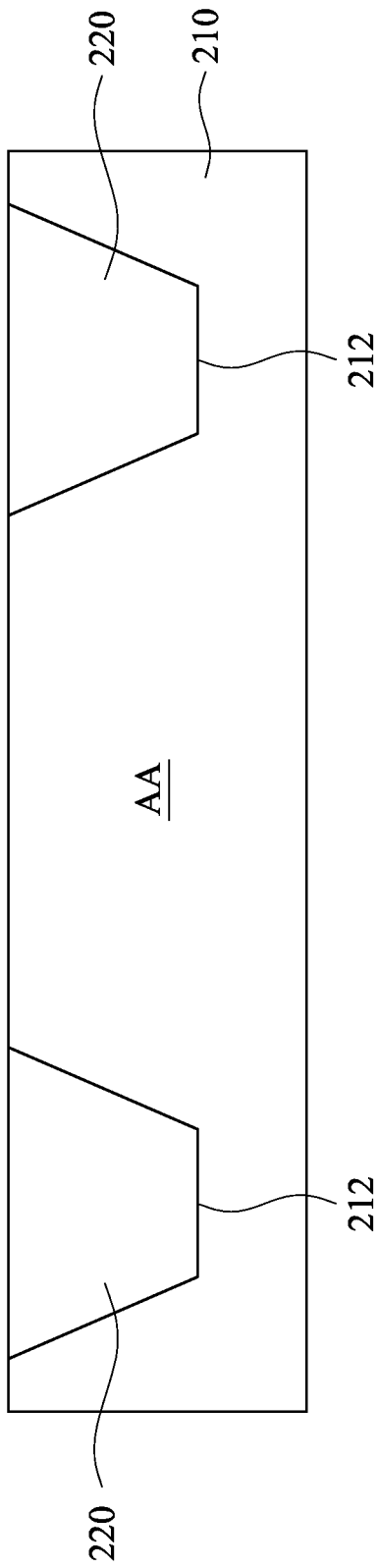
FIG. 2A to FIG. 2D are schematic cross-sectional views of intermediate stages in the formation of a semiconductor derive in accordance with some embodiments of the present disclosure.

FIG. 2A to FIG. 2D are schematic cross-sectional views of intermediate stages in the formation of a semiconductor derive in accordance with some embodiments of the present disclosure. As shown in FIG. 2A, a substrate 210 is provided, and an STI 220 is formed in the substrate 210. The substrate 210 may be provided including a silicon substrate, a bulk silicon substrate, a germanium substrate, a diamond substrate or an SOI substrate. In some other embodiments, the substrate 210 may include a compound semiconductor material such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. An etching process is performed on the substrate 210 to form a shallow trench 212, and then a deposition process is performed to fill isolation material into the shallow trench 212 to form the STI 220. In the etching process, a patterned photoresist layer (not shown) is used as a mask, so as to form the shallow trench 212 in the substrate 210. The etching process for forming the shallow trench 212 may include, for example, an anisotropic etching process, an isotropic etching process, combinations thereof, or another suitable etching process. After the etching process, the patterned photoresist layer (not shown) is stripped. Then, an isolation material is filled in the shallow trench 212, so as to form the STI 220. The isolation material used for forming the STI 220 may be, for example, silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, the isolation material is filled on by utilizing a process, such as a high density plasma CVD (HDPCVD) process, a high aspect ratio process (HARP), a CVD process, a SACVD process, a spin-on coating process, a sputtering process, and/or another suitable process, combinations thereof, and/or another suitable process. In some embodiments, a chemical mechanical polishing (CMP) process may be performed to planarize the upper surface of the STI 220. The area of the substrate 210 surrounded by the STI 220 is defined as an active area AA.

Figure 2B:
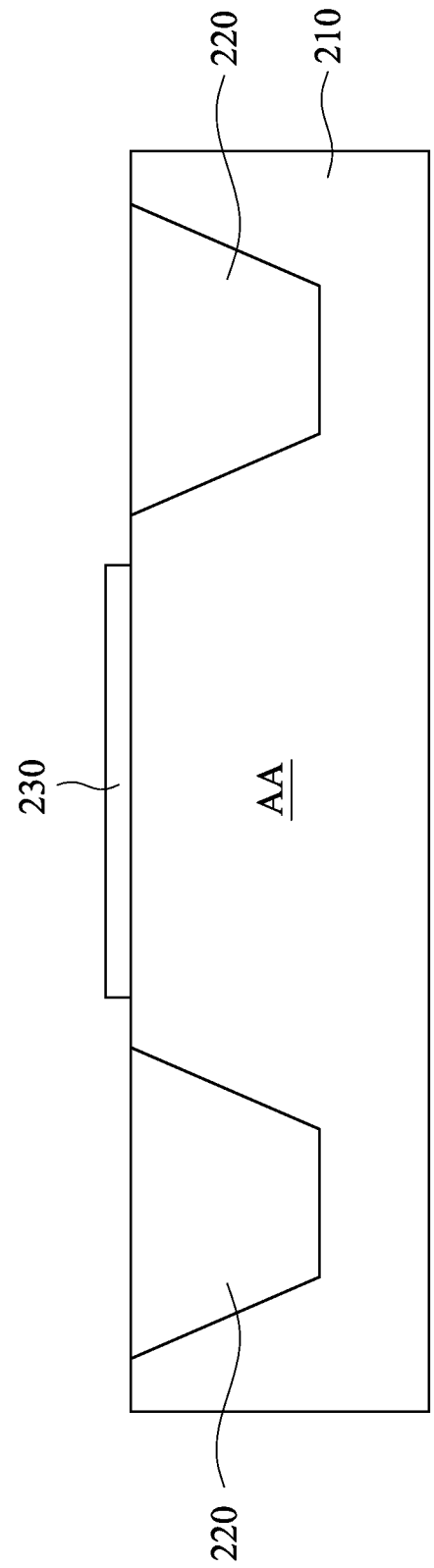

In FIG. 2B, a gate dielectric structure 230 is formed on the active area AA of the substrate 210. The gate dielectric structure 230 may be formed including an oxide material such as, but not limited to, silicon oxide, hafnium oxide, titanium oxide, aluminum oxide, tin oxide, zinc oxide, high-k dielectrics, and combinations thereof. The gate dielectric structure 230 may be formed by using, for example, a CVD process, an atomic layer deposition (ALD) process, a plasma enhanced CVD (PECVD) process, an HDPCVD process, a spin-on coating process, a sputtering process, combinations thereof, and/or another suitable process.

Figure 2C:
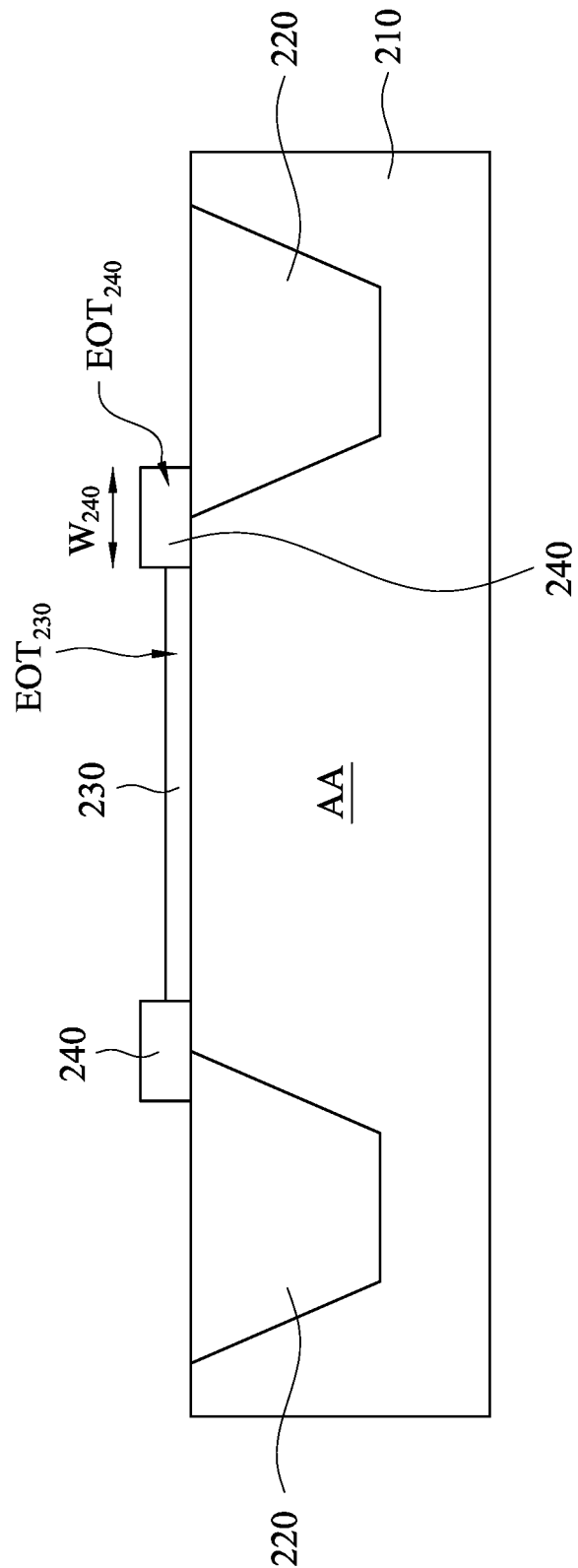

In FIG. 2C, a capping structure 240 is formed adjacent to the gate dielectric structure 230 and at edges of the active area AA. The capping structure 240 may be a frame structure from a top view (as shown by the capping structure 140 in FIG. 1A). Similar to the gate dielectric structure 230, the capping structure 240 may include an oxide material such as, but not limited to, silicon oxide, hafnium oxide, titanium oxide, aluminum oxide, tin oxide, zinc oxide, high-k dielectrics, and combinations thereof, and may be formed by using, for example, a CVD process, an ALD process, a PECVD process, an HDPCVD process, a spin-on coating process, a sputtering process, combinations thereof, and/or another suitable process. The equivalent oxide thickness $EOT_{240}$ of the capping structure 240 is greater than the equivalent oxide thickness $EOT_{230}$ of the gate dielectric structure 230. In particular, if the gate dielectric structure 230 and the capping structure 240 are formed having the same dielectric constant, the thickness of the capping structure 240 is greater than that of the gate dielectric structure 230; if the gate dielectric structure 230 and the capping structure 240 are formed having the same thickness, the dielectric constant of the capping structure 240 is greater than that of the gate dielectric structure 230.

The capping structure 240 is formed having a width $W_{240}$ of at least 1 nm. In some embodiments, the capping structure 240 may be at least partially formed on the active area AA. The capping structure 240 may be formed aligned with or spaced apart from the edge of the STI 220 adjacent to the active area AA. In some embodiments, the width of the portion of the capping structure 240 on the active area AA is between 1 nm and 5 nm.

Alternatively, the capping structure 240 may be completely formed on the STI 220. In some embodiments, the capping structure 240 is formed completely on the STI 220 and aligned with the edge of the active area AA. In such case, the width of the capping structure 240 may be between 1 nm and 5 nm.

In some embodiments, different portions of the capping structure 240 may be formed having different equivalent oxide thicknesses and/or widths. The equivalent oxide thicknesses of the portions of the capping structure 240 are all greater than the equivalent oxide thickness $EOT_{230}$ of the gate dielectric structure 230.

In FIG. 2B and FIG. 2C, the gate dielectric structure 230 is formed, and then the capping structure 240 is formed adjacent to the gate dielectric structure 230. In alternative embodiments, the capping structure 240 is formed, and then the gate dielectric structure 230 is formed adjacent to the capping structure 240 and inside of the region surrounded by the capping structure 240.

Figure 2D:
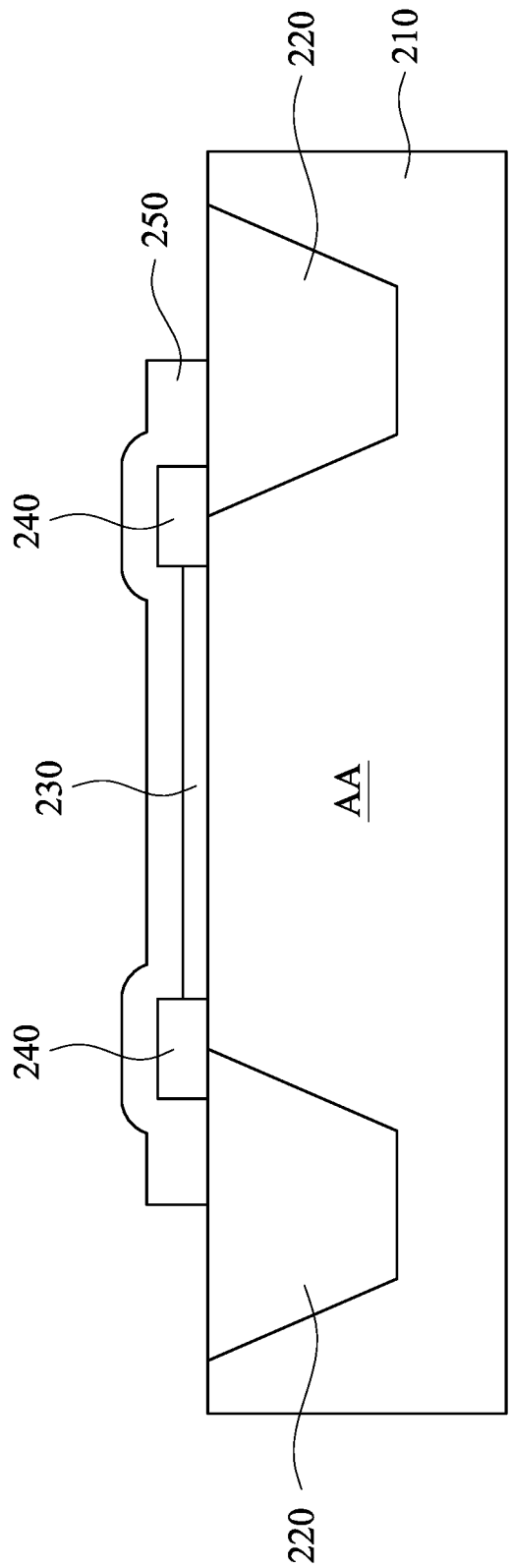

In FIG. 2D, a gate structure 250 is formed on the STI 220, the gate dielectric structure 230 and the capping structure 240. The gate structure 250 may be formed from a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), polysilicon, combinations thereof, and/or another suitable material. The gate structure 250 may be formed by using a PVD process, a CVD process, a low-pressure CVD (LPCVD) process, an ALD process, a spin-on deposition process, a plating process, combinations thereof, and/or another suitable process. A CMP process may further be performed to planarize the gate structure 250 and remove unwanted portions of the gate structure 250.

Figure 3A:
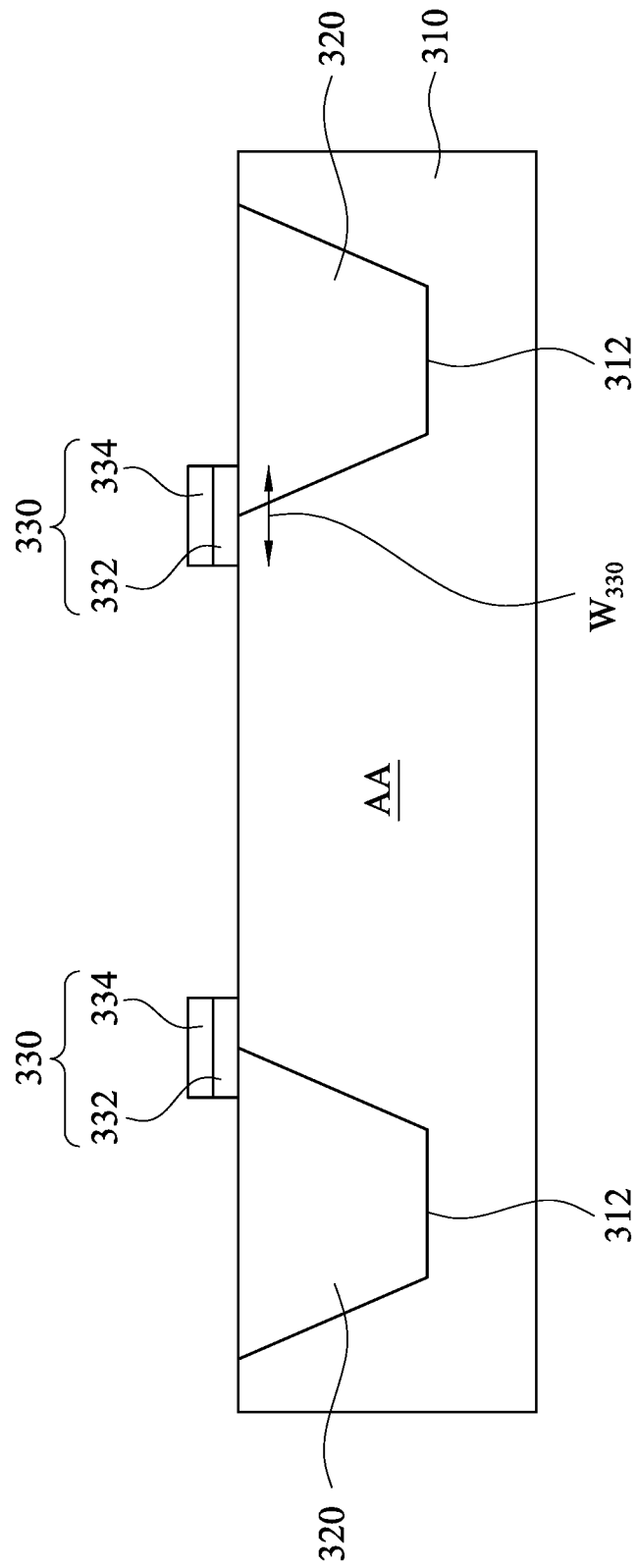
FIG. 3A to FIG. 3C are schematic cross-sectional views of intermediate stages in the formation of a semiconductor derive in accordance with some embodiments of the present disclosure.
Figure 3B:
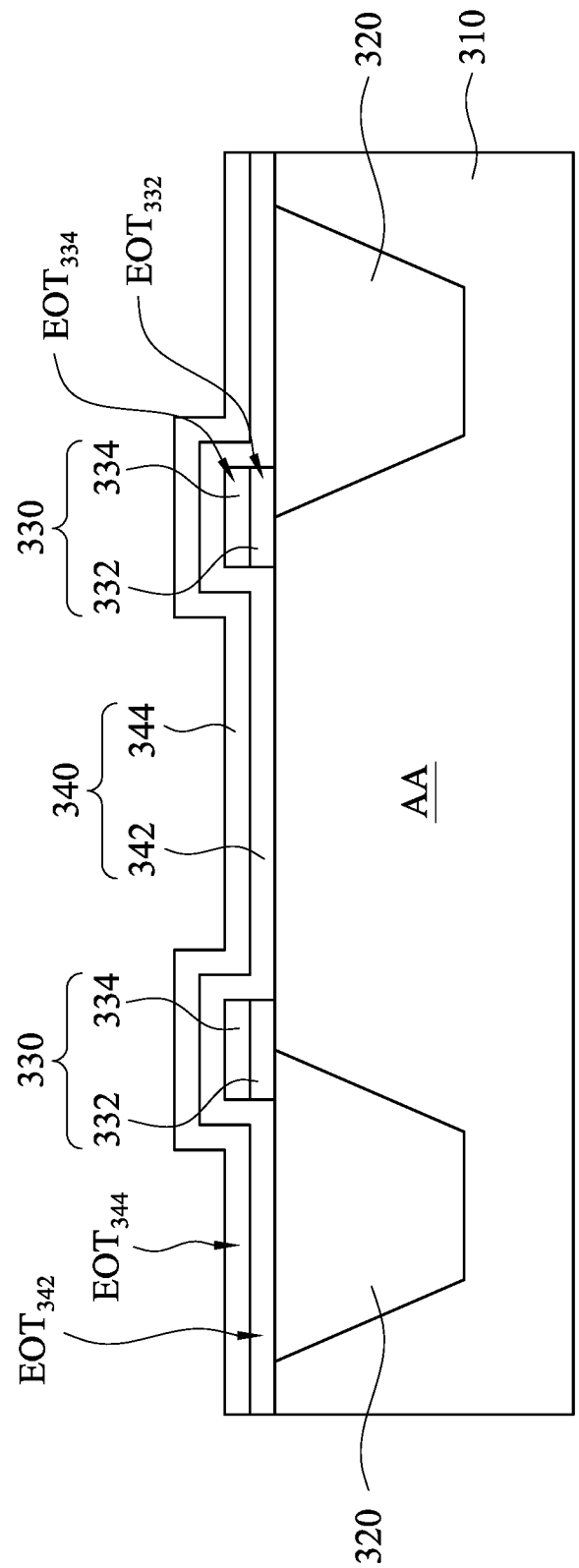
Figure 3C:
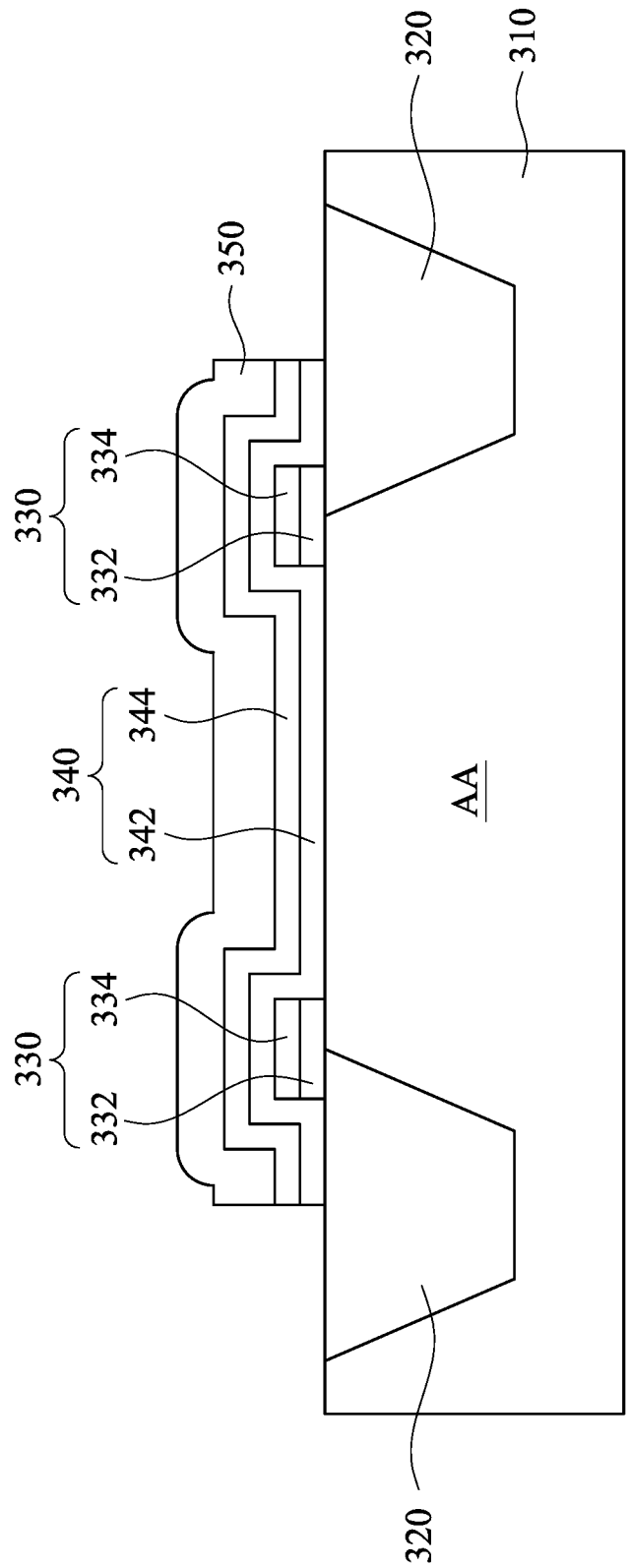

FIG. 3A to FIG. 3C are schematic cross-sectional views of intermediate stages in the formation of a semiconductor derive in accordance with some embodiments of the present disclosure. As shown in FIG. 3A, a substrate 310 is provided, an STI 320 is formed in the substrate 310, and a capping structure 330 is formed on the substrate 310. The substrate 310 may be provided including a silicon substrate, a bulk silicon substrate, a germanium substrate, a diamond substrate or an SOI substrate. In some other embodiments, the substrate 310 may include a compound semiconductor material such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. An etching process is performed on the substrate 310 to form a shallow trench 312, and then a deposition process is performed to fill isolation material into the shallow trench 312 to form the STI 320. In the etching process, a patterned photoresist layer (not shown) is used as a mask, so as to form the shallow trench 312 in the substrate 310. The etching process for forming the shallow trench 312 may include, for example, an anisotropic etching process, an isotropic etching process, combinations thereof, or another suitable etching process. After the etching process, the patterned photoresist layer (not shown) is stripped. Then, an isolation material is filled in the shallow trench 312, so as to form the STI 320. The isolation material used for forming the STI 320 may be, for example, silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, the isolation material is filled on by utilizing a process, such as an HDPCVD process, an HARP, a CVD process, a sub-atmospheric CVD (SACVD) process, a spin-on coating process, a sputtering process, and/or another suitable process, combinations thereof, and/or another suitable process. In some embodiments, a CMP process may be performed to planarize the upper surface of the STI 320. The area of the substrate 310 surrounded by the STI 320 is defined as an active area AA.

After the formation of the STI 320, a capping structure 330 is then formed at edges of the active area AA. The capping structure 330 may be a frame structure from a top view (as shown by the capping structure 140 in FIG. 1A). The capping structure 330 may be formed including an oxide material such as, but not limited to, silicon oxide, hafnium oxide, titanium oxide, aluminum oxide, tin oxide, zinc oxide, high-k dielectrics, and combinations thereof. The capping structure 330 may be formed by using, for example, a CVD process, an ALD process, a PECVD process, an HDPCVD process, a spin-on coating process, a sputtering process, combinations thereof, and/or another suitable process.

The capping structure 330 may be formed including one or more capping layers. As exemplarily illustrated in FIG. 3A, the capping structure 330 is formed including a first capping layer 332 and a second capping layer 334. The first capping layer 332 and the second capping layer 334 may be formed including the same material or different materials, and may be formed by the same process or different processes. The equivalent oxide thickness of the capping structure 330 is the sum of the equivalent oxide thickness $EOT_{332}$ of the first capping layer 332 and the equivalent oxide thickness $EOT_{334}$ of the second capping layer 334. In some other embodiments, the capping structure 330 may be formed including more than two capping layers.

The capping structure 330 is formed having a width $W_{330}$ of at least 1 nm. In some embodiments, the capping structure 330 may be at least partially formed on the active area AA. The capping structure 330 may be formed aligned with or separated from the edge of the STI 320 adjacent to the active area AA. In some embodiments, the width of the portion of the capping structure 330 on the active area AA is between 1 nm and 5 nm.

Alternatively, the capping structure 330 may be completely formed on the STI 320. In some embodiments, the capping structure 330 is formed completely on the STI 320 and aligned with the edge of the active area AA. In such case, the width of the capping structure 330 may be between 1 nm and 5 nm.

In FIG. 3B, a gate dielectric structure 340 is formed on the active area AA and in direct contact with the capping structure 330 in the vertical direction. Similar to the capping structure 330, the gate dielectric structure 340 may include an oxide material such as, but not limited to, silicon oxide, hafnium oxide, titanium oxide, aluminum oxide, tin oxide, zinc oxide, high-k dielectrics, and combinations thereof, and may be formed by using, for example, a CVD process, an ALD process, a PECVD process, an HDPCVD process, a spin-on coating process, a sputtering process, combinations thereof, and/or another suitable process. In some embodiments, the gate dielectric structure 340 is formed covering the capping structure 330.

The gate dielectric structure 340 may be formed including one or more gate dielectric layers. As exemplarily illustrated in FIG. 3B, the gate dielectric structure 340 is formed including a first gate dielectric layer 342 and a second gate dielectric layer 344. The first gate dielectric layer 342 and the second gate dielectric layer 344 may be formed including the same material or different materials, and may be formed by the same process or different processes. The equivalent oxide thickness of the gate dielectric structure 340 is the sum of the equivalent oxide thickness $EOT_{342}$ of the first gate dielectric layer 342 and the equivalent oxide thickness $EOT_{344}$ of the second gate dielectric layer 344. In some other embodiments, the gate dielectric structure 340 may be formed including more than two gate dielectric layers.

In some embodiments, the equivalent oxide thickness of the capping structure 330 (i.e. the sum of the equivalent oxide thickness $EOT_{332}$ of the first capping layer 332 and the equivalent oxide thickness $EOT_{334}$ of the second capping layer 334) is greater than the equivalent oxide thickness of the gate dielectric structure 340 (i.e. the sum of the equivalent oxide thickness $EOT_{342}$ of the first gate dielectric layer 342 and the equivalent oxide thickness $EOT_{344}$ of the second gate dielectric layer 344).

In FIG. 3C, a gate structure 350 is formed on the gate dielectric structure 340 and the capping structure 330. The gate structure 350 may be formed from a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), polysilicon, combinations thereof, and/or another suitable material. The gate structure 350 may be formed by using a PVD process, a CVD process, an LPCVD process, an ALD process, a spin-on deposition process, a plating process, combinations thereof, and/or another suitable process. A CMP process may further be performed to planarize the gate structure 350 and remove unwanted portions of the gate structure 350.

In some embodiments, a portion of the gate dielectric structure 340 which is on the capping structure 330 may be removed before the formation of the gate structure 350. In such case, the equivalent oxide thickness of the capping structure 330 is greater than the equivalent oxide thickness of the gate dielectric structure 340. In particular, if the capping structure 330 and the gate dielectric structure 340 are formed having the same dielectric constant, the thickness of the capping structure 330 is greater than that of the gate dielectric structure 340; if the capping structure 330 and the gate dielectric structure 340 are formed having the same thickness, the dielectric constant of the capping structure 330 is greater than that of the gate dielectric structure 340. Furthermore, in certain embodiments, the capping structure 330 may be formed having different equivalent oxide thicknesses and/or widths, and the equivalent oxide thicknesses of the capping structure 330 are all greater than the equivalent oxide thickness of the gate dielectric structure 340.

Figure 4A:
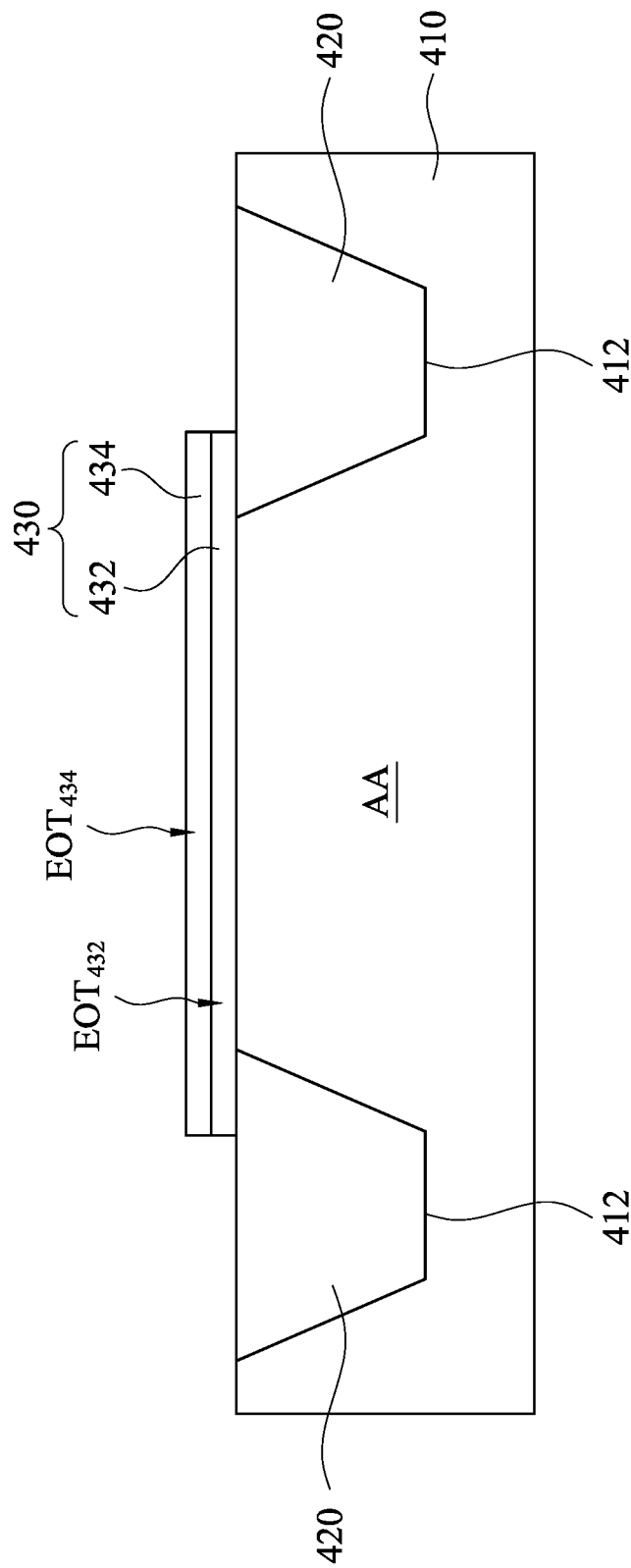
FIG. 4A to FIG. 4C are schematic cross-sectional views of intermediate stages in the formation of a semiconductor derive in accordance with some embodiments of the present disclosure.
Figure 4B:
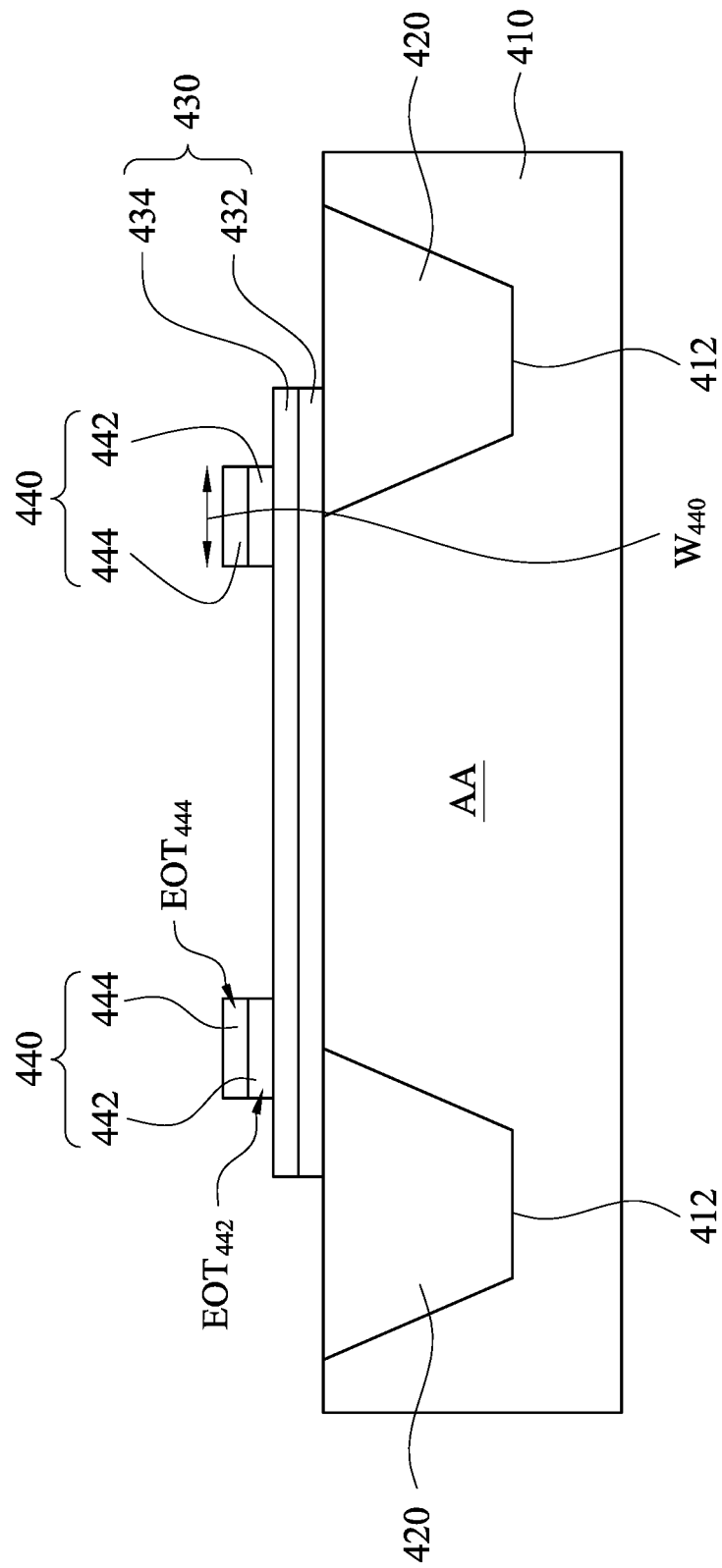
Figure 4C:
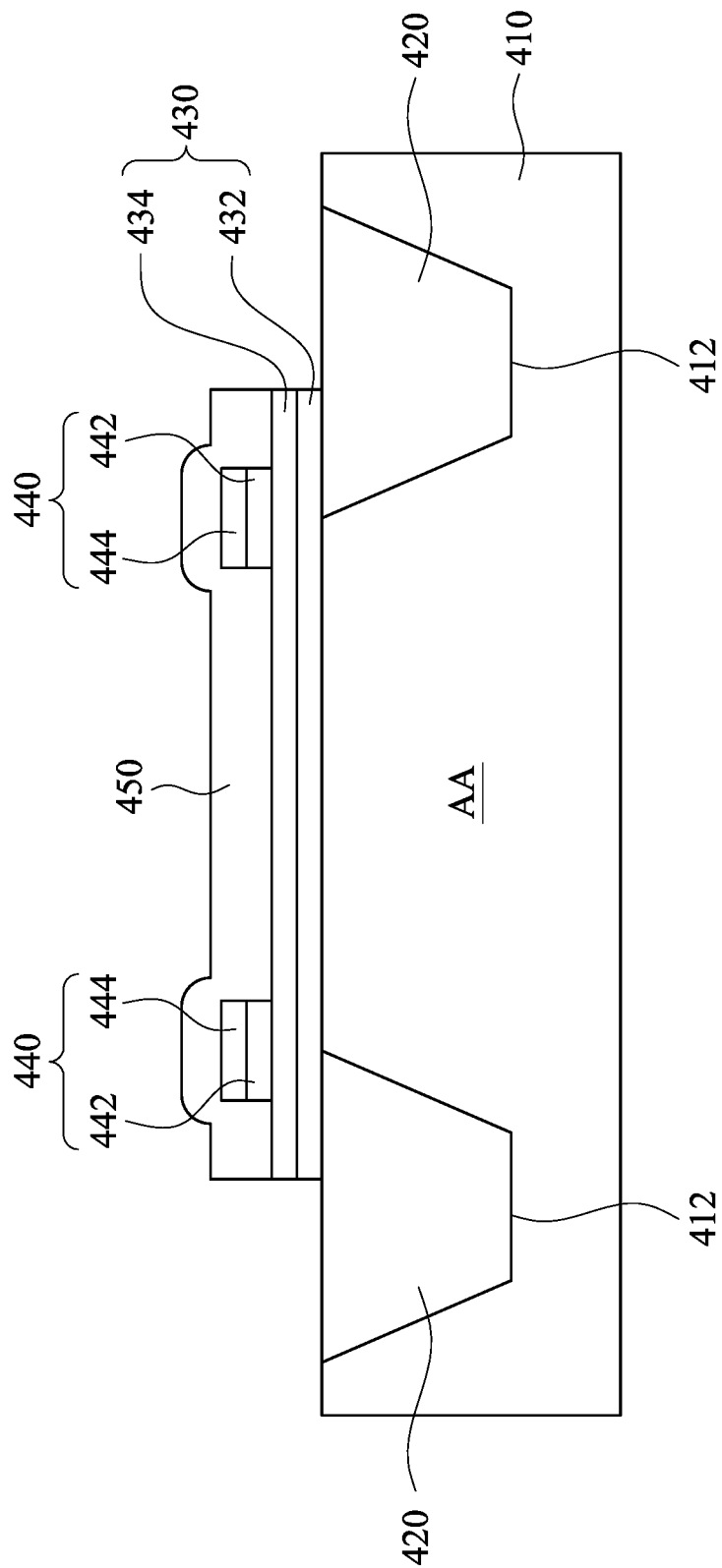

FIG. 4A to FIG. 4C are schematic cross-sectional views of intermediate stages in the formation of a semiconductor derive in accordance with some embodiments of the present disclosure. As shown in FIG. 4A, a substrate 410 is provided, an STI 420 is formed in the substrate 410, and a gate dielectric structure 430 is formed on the substrate 410. The substrate 410 may be provided including a silicon substrate, a bulk silicon substrate, a germanium substrate, a diamond substrate or an SOI substrate. In some other embodiments, the substrate 410 may include a compound semiconductor material such as silicon carbide, silicon germanium, gallium arsenide, gallium carbide, gallium phosphide, indium arsenide and indium phosphide, or an alloy semiconductor, such as silicon germanium, silicon germanium carbide, gallium arsenic phosphide and gallium indium phosphide. An etching process is performed on the substrate 410 to form a shallow trench 412, and then a deposition process is performed to fill isolation material into the shallow trench 412 to form the STI 420. In the etching process, a patterned photoresist layer (not shown) is used as a mask, so as to form the shallow trench 412 in the substrate 410. The etching process for forming the shallow trench 412 may include, for example, an anisotropic etching process, an isotropic etching process, combinations thereof, or another suitable etching process. After the etching process, the patterned photoresist layer (not shown) is stripped. Then, an isolation material is filled in the shallow trench 412, so as to form the STI 420. The isolation material used for forming the STI 420 may be, for example, silicon oxide, silicon dioxide, carbon doped silicon dioxide, nitrogen doped silicon dioxide, germanium doped silicon dioxide, phosphorus doped silicon dioxide, flowable oxide, combinations thereof, and/or another suitable material. In some embodiments, the isolation material is filled on by utilizing a process, such as an HDPCVD process, an HARP, a CVD process, a sub-atmospheric CVD (SACVD) process, a spin-on coating process, a sputtering process, and/or another suitable process, combinations thereof, and/or another suitable process. In some embodiments, a CMP process may be performed to planarize the upper surface of the STI 420. The area of the substrate 410 surrounded by the STI 420 is defined as an active area AA.

After the formation of the STI 420, the gate dielectric structure 430 is then formed on the active area AA. As exemplarily illustrated in FIG. 4A, the gate dielectric structure 430 is formed partially overlapping with the STI 420. In some other embodiments, the gate dielectric structure 430 may be formed within the active area AA. The gate dielectric structure 430 may be formed including an oxide material such as, but not limited to, silicon oxide, hafnium oxide, titanium oxide, aluminum oxide, tin oxide, zinc oxide, high-k dielectrics, and combinations thereof. The gate dielectric structure 430 may be formed by using, for example, a CVD process, an ALD process, a PECVD process, an HDPCVD process, a spin-on coating process, a sputtering process, combinations thereof, and/or another suitable process.

The gate dielectric structure 430 may be formed including one or more gate dielectric layers. As exemplarily illustrated in FIG. 4A, the gate dielectric structure 430 is formed including a first gate dielectric layer 432 and a second gate dielectric layer 434. The first gate dielectric layer 432 and the second gate dielectric layer 434 may be formed including the same material or different materials, and may be formed by the same process or different processes. The equivalent oxide thickness of the gate dielectric structure 430 is the sum of the equivalent oxide thickness $EOT_{432}$ of the first gate dielectric layer 432 and the equivalent oxide thickness $EOT_{434}$ of the second gate dielectric layer 434. In some other embodiments, the gate dielectric structure 430 may be formed including more than two gate dielectric layers.

In FIG. 4B, a capping structure 440 is formed on and in direct contact with the gate dielectric structure 430. A vertical projection of the capping structure 440 on the substrate 410 is at edges of the active area AA. Similar to the gate dielectric structure 430, the capping structure 440 may include an oxide material such as, but not limited to, silicon oxide, hafnium oxide, titanium oxide, aluminum oxide, tin oxide, zinc oxide, high-k dielectrics, and combinations thereof, and may be formed by using, for example, a CVD process, an ALD process, a PECVD process, an HDPCVD process, a spin-on coating process, a sputtering process, combinations thereof, and/or another suitable process. The capping structure 440 may be a frame structure from a top view (as shown by the capping structure 140 in FIG. 1A).

The capping structure 440 may be formed including one or more capping layers. As exemplarily illustrated in FIG. 4B, the capping structure 440 is formed including a first capping layer 442 and a second capping layer 444. The first capping layer 442 and the second capping layer 444 may be formed including the same material or different materials, and may be formed by the same process or different processes. The equivalent oxide thickness of the capping structure 440 is the sum of the equivalent oxide thickness $EOT_{442}$ of the first capping layer 442 and the equivalent oxide thickness $EOT_{444}$ of the second capping layer 444. In some other embodiments, the capping structure 440 may be formed including more than two capping layers.

The capping structure 440 is formed having a width $W_{440}$ of at least 1 nm. In some embodiments, the vertical projection of the capping structure 440 may be at least partially on the active area AA. The vertical projection of the capping structure 440 may be aligned with or be spaced apart from the edge of the STI 420 adjacent to the active area AA. In some embodiments, the capping structure 440 has an overlapping portion of which the vertical projection is within the active area AA, and the width of the overlapping portion of the capping structure 440 is between 1 nm and 5 nm.

Alternatively, the vertical projection of the capping structure 440 may be within an upper surface of the STI 420. In some embodiments, the vertical projection of the capping structure 440 is within the upper surface of the STI 420 and is aligned with the edges of the active area AA. In such case, the width $W_{440}$ of the capping structure 440 may be between 1 nm and 5 nm.

In FIG. 4C, a gate structure 450 is formed on the gate dielectric structure 430 and the capping structure 440. The gate structure 450 may be formed from a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), polysilicon, combinations thereof, and/or another suitable material. The gate structure 450 may be formed by using a PVD process, a CVD process, an LPCVD process, an ALD process, a spin-on deposition process, a plating process, combinations thereof, and/or another suitable process. A CMP process may further be performed to planarize the gate structure 450 and remove unwanted portions of the gate structure 450.

In some embodiments, the capping structure 440 may be having a first portion directly on the gate dielectric structure 430 and a second portion directly on the STI 420. In such case, the equivalent oxide thickness of the capping structure 440 is greater than the equivalent oxide thickness of the gate dielectric structure 430. In particular, if the capping structure 440 and the gate dielectric structure 430 are formed having the same dielectric constant, the thickness of the capping structure 440 is greater than that of the gate dielectric structure 430; if the capping structure 440 and the gate dielectric structure 430 are formed having the same thickness, the dielectric constant of the capping structure 440 is greater than that of the gate dielectric structure 430. Furthermore, in certain embodiments, the capping structure 440 may be formed having different equivalent oxide thicknesses and/or widths. The equivalent oxide thicknesses of the capping structure 440 are all greater than the equivalent oxide thickness of the gate dielectric structure 430.

In accordance with some embodiments, a semiconductor device includes a substrate, an STI, a gate dielectric structure, a capping structure and a gate structure. The STI is in the substrate and defines an active area of the substrate. The gate dielectric structure is on the active area. The capping structure is adjacent to the gate dielectric structure and at edges of the active area. The gate structure is on the gate dielectric structure and the capping structure. An equivalent oxide thickness of the capping structure is substantially greater than an equivalent oxide thickness of the gate dielectric structure.

In accordance with certain embodiments, a method for forming a semiconductor device includes the following steps. A substrate is provided. An STI is formed in the substrate and defines an active area of the substrate. A gate dielectric structure is formed on the active area. A capping structure is formed adjacent to the gate dielectric structure and is at edges of the active area. A gate structure is formed on the gate dielectric structure and the capping structure. The capping structure is formed having an equivalent oxide thickness substantially greater than an equivalent oxide thickness of the gate dielectric structure.

In accordance with some embodiments, a semiconductor device includes a substrate, an STI, a gate dielectric structure, a capping structure and a gate structure. The STI is in the substrate and defines an active area of the substrate. The gate dielectric structure is on the active area. The capping structure is in direct contact with the gate dielectric structure. The capping structure and the gate dielectric structure are overlapped, and a vertical projection of the capping structure on the substrate is at edges of the active area. The gate structure is on the gate dielectric structure and the capping structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate having a top surface;
   a shallow trench isolation (STI) in the substrate, the STI defining an active area of the substrate and extending downward from the top surface of the substrate;
   a gate dielectric structure on the top surface of the substrate within the active area;
   a capping structure on the top surface of the substrate adjacent to the gate dielectric structure, wherein a portion of the capping structure is overlapped with the STI; and
   a gate structure crossing the gate dielectric structure and the capping structure;
   wherein an equivalent oxide thickness of the capping structure is greater than an equivalent oxide thickness of the gate dielectric structure.

2. The semiconductor device of claim 1, wherein the capping structure comprises at least one capping layer.

3. The semiconductor device of claim 1, wherein the gate dielectric structure comprises at least one gate dielectric layer.

4. The semiconductor device of claim 1, wherein the capping structure comprises a plurality of portions, and a portioned equivalent oxide thickness of each of the portions of the capping structure is greater than the equivalent oxide thickness of the gate dielectric structure.

5. The semiconductor device of claim 1, wherein the active area is substantially overlapped by the capping structure.

6. The semiconductor device of claim 1, wherein a dielectric constant of the capping structure is higher than a dielectric constant of the gate dielectric structure.

7. A method of forming a semiconductor device, the method comprising:
   providing a substrate having a top surface;
   forming a shallow trench isolation (STI) in the substrate, the STI defining an active area of the substrate and extending downward from the top surface of the substrate;
   forming a gate dielectric structure on the top surface of the substrate within the active area;
   forming a capping structure on the top surface of the substrate adjacent to the gate dielectric structure and overlapped with the STI; and
   forming a gate structure crossing the gate dielectric structure and the capping structure;
   wherein the capping structure is formed having an equivalent oxide thickness greater than an equivalent oxide thickness of the gate dielectric structure.

8. The method of claim 7, wherein the capping structure is formed of a plurality of portions, and each of the portions of the capping structure is formed having a portioned equivalent oxide thickness greater than the equivalent oxide thickness of the gate dielectric structure.

9. The method of claim 7, wherein forming the capping structure comprises forming at least one capping layer.

10. The method of claim 7, wherein forming the gate dielectric structure comprises forming at least one gate dielectric layer.

11. The method of claim 7, wherein the capping structure is formed substantially overlapping the active area.

12. The method of claim 7, wherein the capping structure is formed having a dielectric constant higher than a dielectric constant of the gate dielectric structure.

13. A semiconductor device, comprising:
   a substrate having a top surface;
   a shallow trench isolation (STI) in the substrate, the STI defining an active area of the substrate and extending downward from the top surface of the substrate;
   a gate dielectric structure on the top surface of the substrate within the active area;
   a capping structure stacked on the gate dielectric structure and in direct contact with a top surface of the gate dielectric structure, wherein a vertical projection of the capping structure on the substrate is at edges of the active area; and
   a gate structure on the gate dielectric structure and crossing the capping structure.

14. The semiconductor device of claim 13, wherein the capping structure is substantially covered by the gate dielectric structure.

15. The semiconductor device of claim 13, wherein the capping structure comprises a plurality of portions, and a portioned equivalent oxide thickness of each of the portions of the capping structure is greater than an equivalent oxide thickness of the gate dielectric structure.

16. The semiconductor device of claim 13, wherein the capping structure comprises at least one capping layer.

17. The semiconductor device of claim 13, wherein the gate dielectric structure comprises at least one gate dielectric layer.

18. The semiconductor device of claim 13, wherein the active area is substantially overlapped by the capping structure.

19. The semiconductor device of claim 13, wherein an equivalent oxide thickness of the capping structure is greater than an equivalent oxide thickness of the gate dielectric structure.

20. The semiconductor device of claim 13, wherein a portion of the capping structure is overlapped with the STI.

* * * * *